Figure 1:
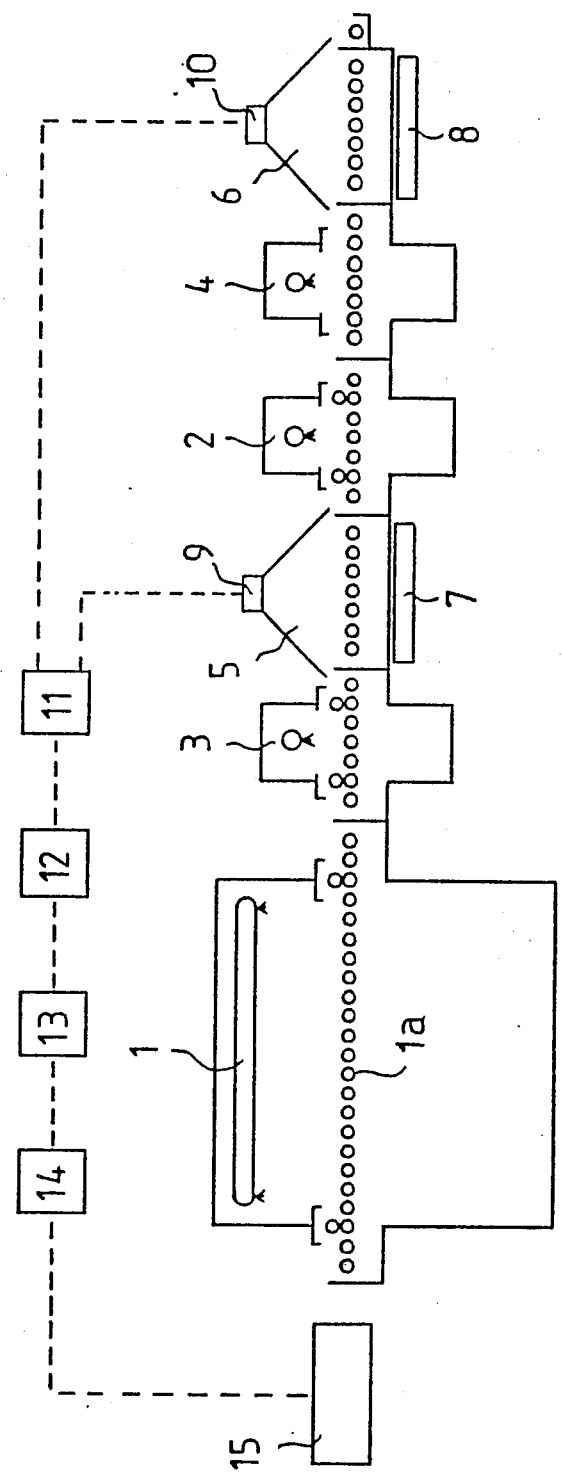

United States Patent [19]

Cooper

[11] Patent Number: 4,772,349
[45] Date of Patent: Sep. 20, 1988

[54] ETCHING MACHINES FOR MANUFACTURING PRINTED CIRCUIT BOARDS

[75] Inventor: Alan J. Cooper, Greenfield, Great Britain

[73] Assignee: Finishing Services Limited, Kempston, England

[21] Appl. No.: 927,319

[22] Filed: Nov. 6, 1986

[30] Foreign Application Priority Data

Nov. 8, 1985 [GB] United Kingdom ............... 8527578

[51] Int. Cl.$^4$ ............................................. C23F 1/02
[52] U.S. Cl. ...................................... 156/345; 134/18; 134/25.4; 156/627
[58] Field of Search ............... 156/345, 626, 627, 640, 156/656; 198/583; 134/25.4, 18

[56] References Cited

U.S. PATENT DOCUMENTS 3,756,898 9/1973 Frantzen et al. ..................... 156/345
3,808,067 4/1974 Brown ............................. 156/345 X Primary Examiner—Kenneth M. Schor
Assistant Examiner—Thi Dang
Attorney, Agent, or Firm—Hayes, Davis & Soloway

[57] ABSTRACT

The machine is of the kind comprising an elongate etch chamber, and a conveyor which is arranged to feed p.c.b's through said etch chamber. In accordance with the invention the etch chamber is divided into two spaced sections comprising a first relatively long main etch section (1) followed by a second relatively short control etch section (2), and two control stations are provided, the first (5) between the two spaced sections, and the second (6) subsequent to said second section, the first and second control stations providing locations for checking and comparing the etch conditions of the p.c.b's at the two stations in order to control the speed of the conveyor appropriately so that the amount of undercut of the p.c.b's exiting from said second etch chamber is kept to a minimum. Preferably, checking is carried out automatically by providing a light source (7,8) beneath the conveyor (1a) at each of the first and second control stations which direct light upwardly through p.c.b's passing through said control stations, light responsive sensor means (9, 10) above the conveyor opposite each light source, which are operative to generate a signal which varies according to the amount of light passing through ach p.c.b, and a comparator to which the signals from both sensor means are fed to produce a correction signal for adjusting the conveyor speed.

5 Claims, No Drawings

ETCHING MACHINES FOR MANUFACTURING PRINTED CIRCUIT BOARDS

This invention relates to etching machines for the manufacture of printed circuit boards (p.c.b's), and in particular the chemical etching of p.c.b's.

In the manufacture of p.c.b's, it is normal practice to feed the boards through a series of processing machines via a conveyor system, the process steps including resist stripping, precleaning, etching, neutralising, water rinsing and drying. The etching machine is generally of the form of an elongate etch chamber with a series of rollers spaced therethrough, the rollers being arranged parallel to each other, normal to the conveying direction. A spray system comprising at least one set of spray nozzles connected to spray pipes is arranged to face towards the rollers to direct etchant onto p.c.b's conveyed along the rollers; in the case where the p.c.b's have circuits to be etched on both faces, of course two sets of such spray nozzles are provided, one above and one below the rollers. The etchant is supplied from a sump, normally provided in the machine, which sump is normally associated with a dosing system, or a regeneration system, to maintain the chemistry of the etchant substantially stable, so that the p.c.b's can be conveyed through the etching machine at a substantially constant conveying speed.

Problems have arisen for many years with such an etching process, due to the fact that it is almost impossible to keep the chemistry of the etchant absolutely stable, even with a regeneration system, with the result that it is normal practice for an operative to control the quality of the etching process by checking visually at a point near to the end of the etch chamber for the presence or absence of copper, to ensure that all excess copper is removed just prior to the p.c.b's exiting from the etch chamber. The problems of such a control stem from the operative being unable to see clearly into the etch chamber, particularly in the case of ammonia based etchants which are blue in colour. In current practice, with such an etchant process, the conveyor is speeded up, by appropriate speed adjustment means, until the p.c.b's exit from the etch chamber with minimal copper showing on the surface, and then the conveyor is slowed down in small increments until the copper just disappears. However, with such a procedure, there is a tendency to over-etch the p.c.b's and therefore undercut the resist, thereby eating into the copper of the printed circuit, since there is no positive and precise control of the slowing down of the conveyor.

An object of the invention is to provide an improved etching machine which overcomes or substantially eliminates the problems discussed above.

According to this invention an etching machine for manufacturing p.c.b's of the kind in which the p.c.b's are fed continuously by a conveyor through an elongate etch chamber, is characterised in that the etch chamber is in two spaced sections comprising a first relatively long main etch section followed by a second relatively short control etch section, and in that two control stations are provided, the first between the two sections and the second subsequent to said second section, said first and second control stations providing locations for checking and comparing the etch conditions of the p.c.b's at the two stations in order to control the speed of the conveyor appropriately so that the amount of undercut of the p.c.b's exiting from said second etch chamber is kept to a minimum.

Thus, in use of a machine in accordance with the invention, fine control of the etching process is achieved by splitting the etching chamber into two, spaced sections; most of the etching is carried out in the main etch section, and fine control of the quality of the finished p.c.b's is carried out in the control etch section. Also, because the p.c.b's pass out of the main etch section before entering the control etch section, a positive and straightforward visual check can be made at this first control section by an operative, which check can easily be compared with a similar visual check at the second control station.

Alternatively, in accordance with an important development feature of the invention, the visual check may be replaced by an automatic comparator system comprising a light source located beneath the conveyor at each of said first and second control stations so as to direct light upwardly through p.c.b's passing through said control stations, light responsive sensor means positioned above the conveyor opposite to each light source, said sensor means being operative to generate a signal which varies according to the amount of light passing through each p.c.b., and a comparator to which the signals from both sensor means are fed to produce an appropriate correction signal for adjusting the speed of the conveyor.

With the development feature discussed immediately above, it has been found that even small traces of copper still to be etched can be identified by the sensor means since these tracks reduce the amount of light passing through the p.c.b's. It has also been found that the sensor means can be arranged to be sufficiently sensitive to identify streaks of copper on the p.c.b's, indicative of a blocked etchant jet.

In order that the invention may be readily understood, one embodiment of etching machine will now be described with reference to the accompanying drawings in which:

FIG. 1 is a diagrammatic view showing the main elements of the etching machine, and, FIGS. 2 to 6 are fragmentary enlarged side views of part of a p.c.b.

Referring to FIG. 1, the etching chamber, is split up between a relatively long main etch section 1 (e.g. 48") and a second relatively short control etch section 2 (e.g. 2"). The sections are separated by a wash section 3 to effect clear viewing and a control station 5 where a clear visual check can be made and compared with a further visual check at a further control section 6 arranged after a further wash section 4 positioned after the control etch section 2. Thus, clear comparative measurements may be made visually at the control sections 5 and 6, and appropriate speed adjustments made manually by an operative. However, in this embodiment, and in accordance with the preferred development feature of the invention, these comparative measurements are carried out automatically by measurement of light levels. For this, light boxes 7 and 8 are provided beneath the conveyor 1a at the two control sections 5 and 6. Light sensors 9 and 10 are located opposite respective boxes 7 and 8 above the conveyor and are each connected to a control unit 11 for advancing or retarding the conveyor speed via a stepping motor 12, potentiometer 13, D.C. motor supply 14, and conveyor drive motor 15.

In use, the sensor means would be preferably photosensitive diodes, e.g. of 5 v which give a range of say 0 to 1.8 v. Depending upon the amount of copper to be etched away from the p.c.b's, i.e. the percentage of copper to be removed, say 50%, the voltage range of the sensors can be scaled, say between 1 to 400 to cover nil amount of light transmitted through an unetched p.c.b. (1) to the amount transmitted through a finished etch p.c.b. (400). The amount of copper to be etched away can thus be controlled according to scale numbers produced via the diodes and a pre-determined programme, via the comparator system.

To understand the degree of control possible with this invention over present methods, the following example is given.

| Typical Data | |
|---|---|
| Length of etch effective | 50 ins. |
| Copper layer thickness | 0.001 ins. |
| Etching time | 50 sec. |
| Etch factor | 2:1 (i.e. etch depth to width ratio) |

Figure 2:
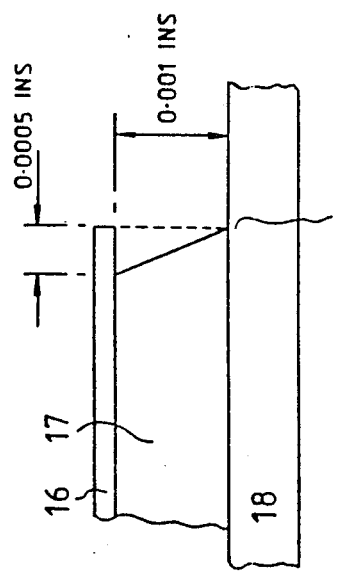
Figure 3:
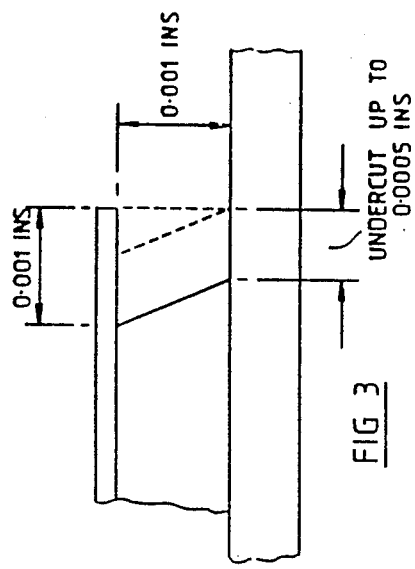
Figure 6:
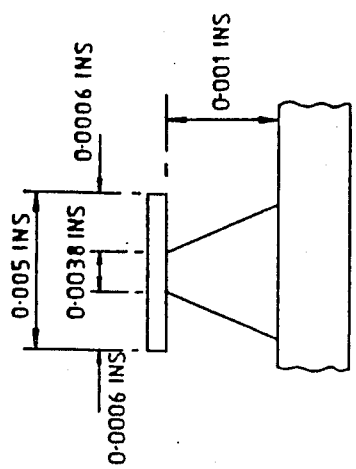

FIG. 2 shows a perfect etch under typical data conditions, where 16 is the resist layer, 17 the copper layer and 18 is the base laminate which is normally translucent. Thus, if will be seen that with zero undercut at the base laminate, there is nevertheless an undercut of the copper at the resist layer of approximately 0.0005 ins. In practice, as discussed above, a zero undercut cannot easily be achieved, and an accepted standard of control using skilled operators making visual checks is shown in FIG. 3. Thus, it will be seen that an undercut of up to 0.0005 ins is tolerated at the base laminate, which therefore produces an undercut of 0.001 ins at the resist layer.

Figure 4:
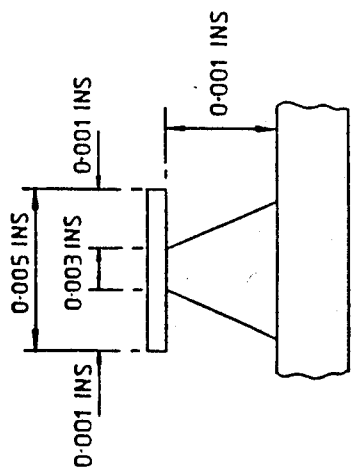

However, in many cases, even this degree of control is not reliable, making the manufacture of printed circuits with track widths of less than 0.005" difficult. A typical track section illustrating this limitation is shown in FIG. 4, where it can be seen that the total width of the track can be as little as 0.003 ins at the resist layer.

Figure 5:
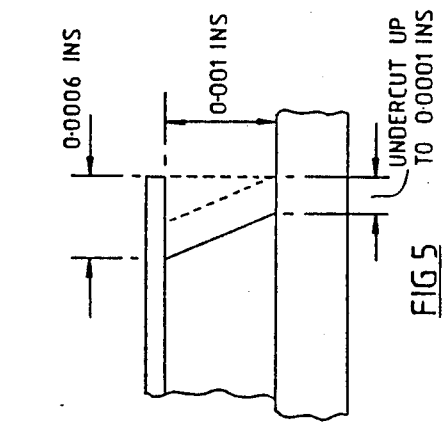

Referring now to FIG. 5, this shows the degree of control possible using the new improved etching machine, where the effective etch length of 50 ins. is preferably divided between a main etch chamber of 48 ins., and a control etch chamber of 2 ins. The data for this system would be modified thus:

| Modified Data | |
|---|---|
| Length of Main Etch | 48 ins. |
| Length of Control Etch | 2 ins. |
| Etch time, Main Etch | 48 sec |
| Etch time, Control Etch | 2 sec |
| Copper removed, Main Etch | 0.0008 ins |
| Copper removed, Control Etch | 0.0002 ins |

Thus, it can be seen that the undercut at the base laminate can be contained to a dimension up to 0.0001 ins, with the result that the undercut at the resist layer is kept to 0.0006". Therefore, for a typical track section of 0.005" at the base laminate as discussed above with reference to FIG. 4, referring now to FIG. 6, it will be seen that the width of track at the resist layer is increased to 0.0038. Thus by reducing the undercut to controlled limits in accordance with the invention, the production of track widths less than 0.005 ins. is made more reliable.

I claim:

1. An etching machine for manufacturing printed circuit boards comprising an elongate etch chamber, and a conveyor which is arranged to feed printed circuit boards through said etch chamber, characterised in that said etch chamber is divided into two spaced chamber sections comprising a first relatively long main etch chamber section followed by a second relatively short control etch chamber section which is substantially shorter than said main etch chamber section, and in that two control stations are provided, the first being outside and between said two spaced chamber sections, and the second being outside and located subsequent to said second chamber section, said first and second control stations providing locations for and means for checking and comparing the etch conditions of the printed circuit boards at the two stations in order to control the speed of the conveyor appropriately so that the amount of undercut of the printed circuit boards exiting from said second etch chamber section is kept to a minimum, and means for controlling said speed.

2. An etching machine according to claim 1, characterised in that a light source is located beneath the conveyor at each of said first and second control stations which is arranged to direct light upwardly through printed circuit boards passing through said control stations, in that light responsive sensor means are positioned in the control stations outside of the etch chamber sections above the conveyor opposite to each light source, said sensor means being operative to generate a signal which varies according to the amount of light passing through each printed circuit board, and in that a comparator is provided to which the signals from both sensor means are fed to produce an appropriate correction signal for adjusting the speed of the conveyor.

3. An etching machine according to claim 2, characterised in that said control means are means to which the correction signal is fed from the comparator, said control means comprising a control unit which feeds the correction signal via a stepping motor and potentiometer to a D.C. Motor supply which in turn appropriately effects an adjustment in the speed of the conveyor.

4. An etching machine according to claim 2, characterised in that each said sensor means comprises a number of photosensitive devices which cover a set voltage range and provide scale numbers to cover nil to a maximum amount of light transmitted through the printed circuit boards, such that the amount of etching is controlled in accordance with the scale members produced via said photosensitive devices.

5. An etching machine according to claim 4, characterised in that said photosensitive devices feed a signal indicative of the scale numbers produced to said comparator, where said scale numbers compared with a pre-determined programme.

* * * * *